(12) United States Patent
Seung (10) Patent No.: US 8,949,552 B2
(45) Date of Patent: *Feb. 3, 2015

(54) COPYING APPARATUS FOR COPYING A RECODING MEDIUM, A METHOD THEREOF AND A COMPUTER PROGRAM THEREOF

(75) Inventor: Heung-Chan Seung, Seoul (KR)

(73) Assignee: Settec, Inc., Seoul (KR)

( * ) Notice: Subject to any disclaimer, the term of this patent is extended or adjusted under 35 U.S.C. 154(b) by 938 days.

This patent is subject to a terminal disclaimer.

(21) Appl. No.: 11/965,707

(22) Filed: Dec. 27, 2007

(65) Prior Publication Data

US 2008/0159107 A1 Jul. 3, 2008

Related U.S. Application Data

(63) Continuation of application No. 10/484,510, filed on Sep. 7, 2004, now abandoned.

(51) Int. Cl.
| | | |
|---|---|---|
| G06F 12/00 | (2006.01) | |
| G06F 13/00 | (2006.01) | |
| G06F 13/28 | (2006.01) | |
| G11B 20/00 | (2006.01) | |
| G11B 20/18 | (2006.01) | |
| H03M 13/29 | (2006.01) | |

(52) U.S. Cl.
CPC .... *G11B 20/00644* (2013.01); *G11B 20/00086* (2013.01); *G11B 20/00652* (2013.01); *G11B 20/00688* (2013.01); *G11B 20/1803* (2013.01); *H03M 13/29* (2013.01)
USPC .......................................................... 711/154

(58) Field of Classification Search
CPC .................... G11B 20/00086; G11B 20/00644; G11B 20/00652; G11B 20/00688; G11B 20/1803
USPC .......................................................... 711/154
See application file for complete search history.

(56) References Cited

U.S. PATENT DOCUMENTS

| | | | | | |
|---|---|---|---|---|---|
| 3,766,529 | A | * | 10/1973 | McLaughlin | 700/95 |
| 4,433,211 | A | * | 2/1984 | McCalmont et al. | 380/36 |
| 4,703,465 | A | * | 10/1987 | Parker | 369/84 |
| 4,991,036 | A | * | 2/1991 | O'Brien | 360/71 |
| 5,132,522 | A | * | 7/1992 | Oshiba | 235/454 |
| 5,151,797 | A | * | 9/1992 | Nosaki et al. | 358/474 |
| 5,285,433 | A | * | 2/1994 | Oshiba et al. | 369/44.26 |
| 5,298,730 | A | * | 3/1994 | Rokutan | 235/476 |
| 5,308,961 | A | * | 5/1994 | Nishimura | 235/454 |

(Continued)

FOREIGN PATENT DOCUMENTS

| | | |
|---|---|---|
| JP | 62-150564 A | 7/1987 |
| JP | 2001-110137 A | 4/2001 |

(Continued)

OTHER PUBLICATIONS

International Search Report in International Application No. PCT/KR2002/001661, dated May 28, 2003.

(Continued)

*Primary Examiner* — Sheng-Jen Tsai
(74) *Attorney, Agent, or Firm* — Park, Kim & Suh, LLC (57) ABSTRACT

A Copying Apparatus for copying a recoding medium, a method thereof and a computer program thereof is provided, wherein the recording medium is copy-protected by a predetermined method.

6 Claims, 8 Drawing Sheets

(56) References Cited

U.S. PATENT DOCUMENTS

| | | | |
|---|---|---|---|
| 5,594,709 A * | 1/1997 | Nagano et al. | 369/30.23 |
| 5,661,800 A | 8/1997 | Nakashima et al. | |
| 5,790,264 A * | 8/1998 | Sasaki et al. | 358/426.11 |
| 5,930,209 A | 7/1999 | Spitzenberger et al. | |
| 6,026,468 A * | 2/2000 | Mase et al. | 711/111 |
| 6,075,899 A * | 6/2000 | Yoshioka et al. | 382/233 |
| 6,311,259 B1 * | 10/2001 | Boyer et al. | 711/201 |
| 6,487,633 B1 * | 11/2002 | Horst et al. | 711/112 |
| 6,490,683 B1 | 12/2002 | Yamada et al. | |
| 6,618,548 B1 | 9/2003 | Inoue et al. | |
| 6,813,229 B1 * | 11/2004 | Gotou et al. | 369/44.37 |
| 6,856,755 B1 * | 2/2005 | Lin et al. | 386/241 |
| 8,773,961 B2 * | 7/2014 | Seung | 369/53.21 |
| 2001/0024411 A1 * | 9/2001 | Pirot et al. | 369/53.21 |
| 2004/0001397 A1 * | 1/2004 | Jeong et al. | 369/30.11 |
| 2004/0027609 A1 * | 2/2004 | Isaka et al. | 358/1.15 |
| 2004/0199780 A1 * | 10/2004 | Seung | 713/193 |
| 2005/0047195 A1 * | 3/2005 | Seung | 365/154 |
| 2005/0114289 A1 * | 5/2005 | Fair | 707/1 |
| 2008/0159107 A1 * | 7/2008 | Seung | 369/84 |
| 2008/0182057 A1 * | 7/2008 | Seung | 428/64.1 |

FOREIGN PATENT DOCUMENTS

| | | |
|---|---|---|
| WO | 98/54713 A1 | 12/1998 |
| WO | 00/21085 A1 | 4/2000 |
| WO | 01/59774 A1 | 8/2001 |
| WO | 03/081590 A1 | 10/2003 |

OTHER PUBLICATIONS

International Search Report in International Application No. PCT/KR2002/000490, dated Dec. 24, 2002.

U.S. Office Action in U.S. Appl. No. 10/484,510 dated Feb. 6, 2007.

* cited by examiner

COPYING APPARATUS FOR COPYING A RECODING MEDIUM, A METHOD THEREOF AND A COMPUTER PROGRAM THEREOF

CROSS REFERENCE TO RELATED APPLICATIONS

This application is a continuation of prior application Ser. No. 10/484,510, filed 2004 Sep. 7.

BACKGROUND OF THE INVENTION

1. Field of the Invention

The present invention relates to a copying apparatus for copying a recording medium, a method and a computer program thereof, and more particularly to a copying apparatus for copying a recording medium, a method and a computer program thereof where address information of a recording area is manipulated.

The present invention relates to a copying apparatus for successfully copying an optical recording medium, which is or will be in existence, such as an audio compact disc, a combination of compact discs, a compact disc including other optical recording medium, a compact disc included in other optical recording medium and a CD-R (CD-Recordable) or CD-RW (CD-Rewritable).

Moreover, the present invention is also applied to a recording medium on which digital information such as high quality video signals are recorded, e.g. a DVD (Digital Versatile Disc or Digital Video disc), DVD-R (DVD-Recordable), DVD-RW (DVD-Rewritable), DVD-RAM (DVD-Random Access Memory) or the like.

2. Description of the Prior Art

Generally, for example, in order to retrieve the information recorded on a recording medium by controlling the medium to a reproducing apparatus, it is necessary to obtain the address information indicating where the information is recorded. The recording type of the information needed to record the address information, the content information and/or the like on the recording medium and the information structure of the recording medium are widely known in the art of the present invention.

Figure 1:
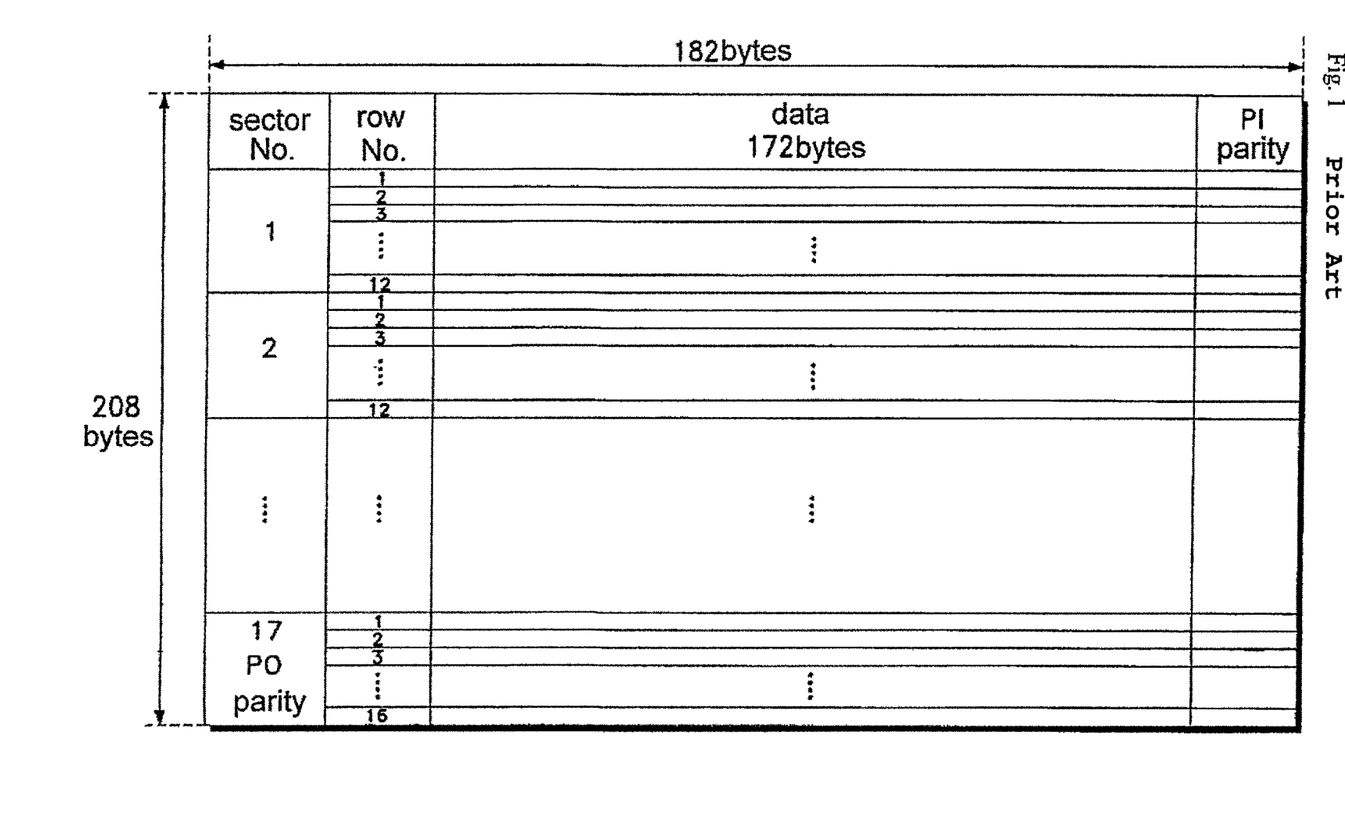
FIG. 1 shows an example of the structure of information recorded on a general DVD.

FIG. 1 shows an example of the structure of information recorded on a general DVD. As shown in FIG. 1, the information recorded on the DVD constitutes a '(information) sector' with a predetermined amount of the information per unit. 17 information sectors are formed in total as shown in FIG. 1. Each of the information sectors includes the content information of 172 bytes and horizontally error correcting parity data of 10 bytes. And, the 17-th sector includes vertically error correcting parity data of 10 bytes. FIG. 1 shows merely an example of the information structure of a general DVD, so it does not limit the scope of the present invention.

In the recording medium with the information structure as above, the address data represents which position on the recording medium certain information is stored at, and thus a part of the address data may serve as the information indicating the position of the sector. The reproducing apparatus generates required control signals by using this address data and performs reproducing operations. For example, when the reproducing apparatus moves over the recording medium or reproduces the medium from a certain position, it can control an operation of searching the information recorded on the medium by referring to the address data.

Recently, however, it is possible to read the information recorded on an optical recording medium easily by using a general personal computer. Consequently, illegal copying which is very easy and diverse has become common and widely accepted. Thus, the protection for the copyright of contents recorded on a medium has become an urgent issue.

Accordingly, the applicant of the present invention has disclosed a copy-protected optical recording medium capable of being reproduced by a general reproducing apparatus, comprising at least one overlapping zone whose address values allocated to information recorded on the recording medium overlap address values of another area in the recording medium and driving information for controlling the reproducing apparatus to read information on the overlapping zone in "a copy-protected optical recording medium capable of being reproduced by a general reproducing apparatus and a method for manufacturing thereof", International Application No. PCT/KR02/00490 filed on 22 Mar. 2002.

The copy-protected optical recording medium, International Application No. PCT/KR02/00490, will be described in detail referring to FIGS. 2a and 2b.

Figure 2A:
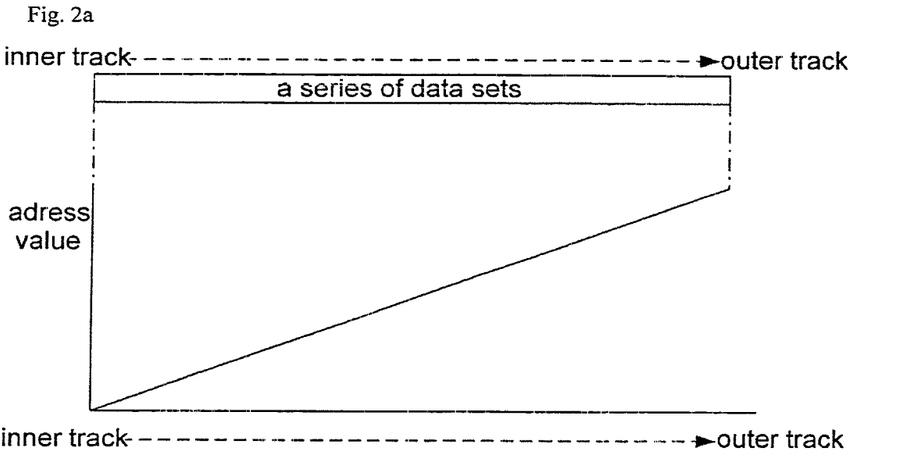
FIG. 2a shows a series of pieces of the information, hypothetically arranged in a row, recorded on from an innermost track to an outermost track of a general optical recording medium and address values allocated to the series of pieces of the information.

FIG. 2a shows a series of pieces of information, hypothetically arranged in a row, recorded on from an innermost track to an outermost track of a general optical recording medium and address values allocated to the series of pieces of the information. And, FIG. 2b shows a series of pieces of information, hypothetically arranged in a row, recorded on from the innermost track to the outermost track of the copy-protected optical recording medium according to the International Application No. PCT/KR02/00490 and address values allocated to the series of pieces of the information.

As shown in FIG. 2a, the address values of the information on the general optical recording medium are allocated in order to linearly increase from the inner tracks to the outer tracks of the medium sequentially. A linearly increased graph is shown at the bottom of the series of pieces of the information. The address values may also linearly decrease from the inner tracks to the outer tracks.

Moreover, in another optical recording medium already known, the information may be chaotically placed on the medium by scrambling the address data. In this way, the reproduction ratio can be increased by correcting errors, even if any physical damage occurs at a certain area on the medium. Even In this case, however, supposing a state where retrieved information is arranged in a row as shown in FIG. 2a, we can understand that the address values linearly increase (or decrease) conceptually.

Figure 2B:
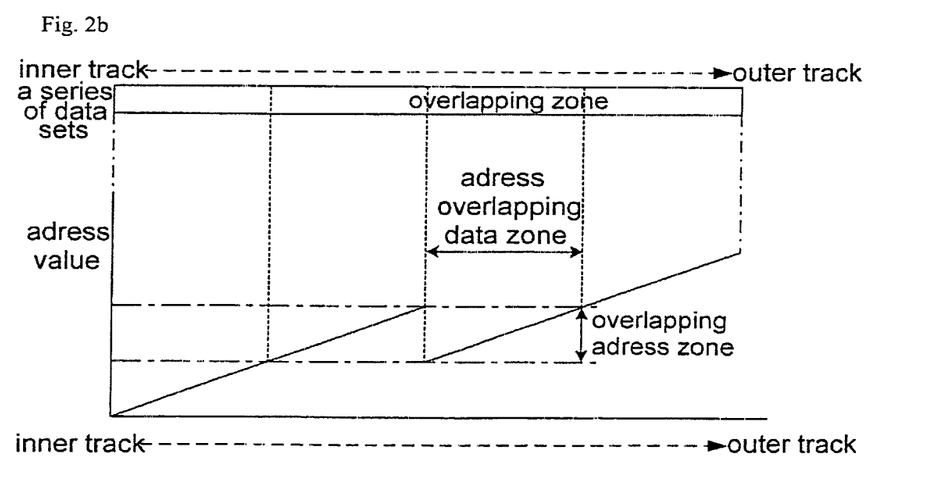
FIG. 2b shows a series of pieces of the information, hypothetically arranged in a row, recorded on from the innermost track to the outermost track of the copy-protected optical recording medium according to the prior art and address values allocated to the series of pieces of the information.

Meanwhile, as shown in FIG. 2b, the copy-protected optical recording medium according to the International Application No. PCT/KR02/00490 includes at least one overlapping zone whose address values allocated to the information on the medium overlap each other. The address values may be either physical or logical addresses. In FIG. 2a, it is shown that the address values in the overlapping zone and those in a previous zone (referred to as "zone B") overlap each other.

Moreover, the copy-protected optical recording medium according to the International Application No. PCT/KR02/00490 further includes driving information at a predetermined area for controlling the reproducing apparatus in order to read the information recorded on the overlapping zone. The data on the zone B has the same address values as those of the corresponding data on the overlapping zone, so that the driving information is for driving the reproducing apparatus to access the addresses respectively.

In order to copy the information recorded on a recording medium according to the International Application No. PCT/KR02/00490 in an already known method, it is necessary to use the address data allocated to the above zones for recording information from the zone B and the overlapping zone on a recording medium as a duplicate. Consequently, only one of the pieces of the information on the zone B and the overlapping zone is recorded on a zone with a corresponding address value of the copied medium.

Therefore, when reproducing the copied medium recorded in this way, it is impossible to retrieve one of the pieces of the information on the zone B and the overlapping zone of the original medium from the copied medium. Accordingly, some pieces of the information on the original medium remain not capable of being copied.

Therefore, in the case of the duplicated medium, the data retrieved from a position to which a certain address is allocated is the same regardless of the reproduction progress direction. Since that result is different from a case of the original medium where pieces of data on a position to which the same address is allocated can be different from one another depending on the progress direction, it is possible to discriminate the copied medium from the original medium. Accordingly, by that point an original medium can be protected against duplication or at least can be prevented from reproducing the duplicate of it.

In case of the copy-protected recording medium as above, however, the method causes a problem that a lawful owner also cannot copy any recording medium even within a permitted scope under a law.

SUMMARY OF THE INVENTION

The applicant of the present invention acknowledges the necessity of permitting a lawful owner, lawful manufacturer, lawful user or the like (hereinafter referred to as a "lawful user" generally) of a copy-protected recording medium according to the International Application No. PCT/KR02/00490 to copy it within the permitted scope under the law. Accordingly, it is an object of the present invention to provide a lawful user with a means for copying a recording medium including an overlap zone where addresses are overlapped over one another as described above.

In order to achieve the objects above, a recording medium copying apparatus for copying a recording medium which comprises an overlap zone where addresses overlap, includes a file reading unit for reading and managing a file in a forward and/or reverse direction, the file recorded on an original recording medium to be copied, a file comparing and identifying unit for comparing the files read from the original recording medium and identifying whether the files are identical to each other or not, an address processing unit for collecting addresses of the files with regard to the original recording medium and generating and assigning an address at which the file is recorded on a duplicate recording medium and a file recording unit for recording the file on the duplicate recording medium at the address assigned by the address processing unit in order that an address structure of the duplicate recording medium can be the same as that of the original recording medium.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, exemplary embodiments of the present invention will now be described in detail with reference to attached drawings.

Figure 3:
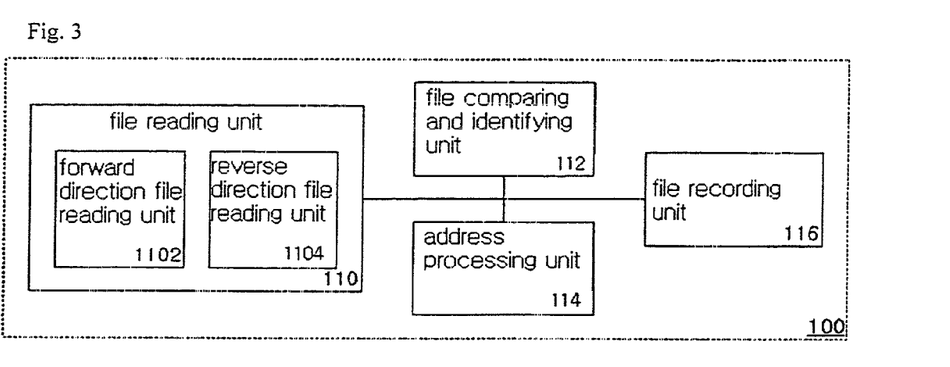
FIG. 3 is a functional block diagram schematically showing an exemplary embodiment of a recording medium copying apparatus 100 according to the present invention.

FIG. 3 is a functional block diagram schematically showing an exemplary embodiment of a recording medium copying apparatus 100 according to the present invention. As shown in FIG. 3, the copying apparatus 100 according to is the present invention includes a file reading unit 110 for forwardly and/or reversely reading and managing data of a file recorded on a original recording medium desired to be copied, a file comparing and identifying unit 112 for comparing files read from the original recording medium and identifying files whether they are identical to each other or not, an address processing unit 114 for collecting addresses of the files with regard to the original recording medium and generating and assigning addresses for recording the files on a duplicate recording medium and a file recording unit for recording the files at the addresses assigned by the address processing unit 114 on the duplicate recording medium.

When an original recording medium of a structure as shown in FIG. 2b is put inside the copying apparatus 100, the file reading unit 110 reads data on the original recording medium in a direction (hereinafter referred to as a "forward direction") which is from a position (hereinafter referred to as a "head of recording medium") whose address has the smallest value to a position (hereinafter referred to as an "end of recording medium") whose address has the largest value and retrieves files recorded on the recording medium. These files retrieved in the forward direction as above will be referred to herein as "forward direction files".

The files read by the file reading unit 110 in the forward direction are stored and managed in a memory (not shown) in a retrieved order together with their addresses. To store and manage in a memory in a retrieved order can be realized by a manner of, e.g. assigning the lowest number to the identification number of a file first retrieved from the original recording medium while assigning the highest number to the identification number of a last retrieved file. Therefore, to store in order does not always mean to store files retrieved later at areas whose physical or logical addresses of a memory are high.

In addition, the file reading unit 110 reads data on the original recording medium in a direction (hereinafter referred to as a "reverse direction") opposite to the forward direction, i.e. from the end of recording medium to the head of recording medium and retrieves files on it. The files (hereinafter referred to as "reverse direction files") retrieved in the reverse direction are stored in the memory in an order opposite to the retrieved order together with their addresses. To store and manage in a memory in a reverse order can be realized by a manner of, e.g. assigning the lowest number to the identification number of a file last retrieved from the original recording medium while assigning the highest number to the identification number of a first retrieved file. Therefore, to store in order does not always mean to store files retrieved later at areas whose physical or logical addresses of a memory are low.

Further, as shown in FIG. 3, the forwardly or reversely reading operation of files and the storing and managing operation of retrieved files may be performed by a forward direction file reading unit 1102 and a reverse direction file reading unit 1104 in parallel respectively.

The storage and management of retrieved files will be described in detail later referring to FIGS. 4 and 5.

Next, the file comparing and identifying unit 112 compares the forward and reverse direction files that correspond to each other and judges whether the compared files are identical to each other or not. In addition, as the result of the judgment, the file comparing and identifying unit 112 discriminates files judged to be identical from files judged not.

Next, the address processing unit 114 collects and stores the addresses of the files read by the file reading unit 110 from the original recording medium. In addition, when the address processing unit 114 records the files onto the duplicate recording medium, it assigns addresses at which the files are recorded on the duplicate recording medium in order that the duplicate recording medium can have the same address structure as that of the original recording medium. In this case, the address processing unit 114 assigns addresses of the duplicate recording medium in order that the forward and reverse direction files judged by the file comparing and identifying unit 112 not to be identical to each other can have the same address respectively, and thus it makes the address structures of the duplicate recording medium and the original recording medium the same as shown in FIG. 2b.

Next, the file recording unit 116 records the forward and reverse direction files on the duplicate recording medium at the addresses assigned by the address processing unit 114. In other words, the file recording unit 116 records either the forward or reverse direction file judged to be identical to each other on the duplicate recording medium. Meanwhile, the file recording unit 116 records the forward direction file judged not to be identical on the duplicate recording medium in advance and then successively records the corresponding reverse direction file judged not to be identical.

Recording of files is performed in order that the duplicate recoding medium can surely have the same structure as that of the original recording medium. The physical positions of the duplicate and original recording medium where a certain file is recorded do not need to be identical to each other. Although the addresses of the duplicate and original recording medium assigned to a certain file are preferably the same value, they are not be limited to this case and it should be noted that it might be enough for overall address structures to be identical to each other.

Next, the operation of the copying apparatus of the present invention will be described in detail referring to FIGS. 4 and 5. FIG. 4 is a flowchart showing an exemplary embodiment of the operation of the copying apparatus according to the present invention. When the operations begin with an instruction of a user upon inserting the original recording medium (step S400), the original recording medium is read in the forward and/or reverse direction so that files can be retrieved (steps S402 and S408). The operations of reading files in the forward and/or reverse direction may also be performed sequentially or in parallel as described above.

Then, the files retrieved in the forward direction are stored in a memory (not shown) in a retrieved order. If the firstly retrieved forward direction file is represented by "F.file.1", the secondly retrieved forward direction file is represented by "F.file.2" and the N-thly retrieved forward direction file is represented by "F.file.N", these are stored in the memory in order to be identified in the retrieved order. In this embodiment, to identify them in the retrieved order, an example using a manner of assigning identification numbers consecutively increasing is shown (step S4042). "1), 2) . . . n)" shown in the step S4042 means the retrieved order.

Figure 4:
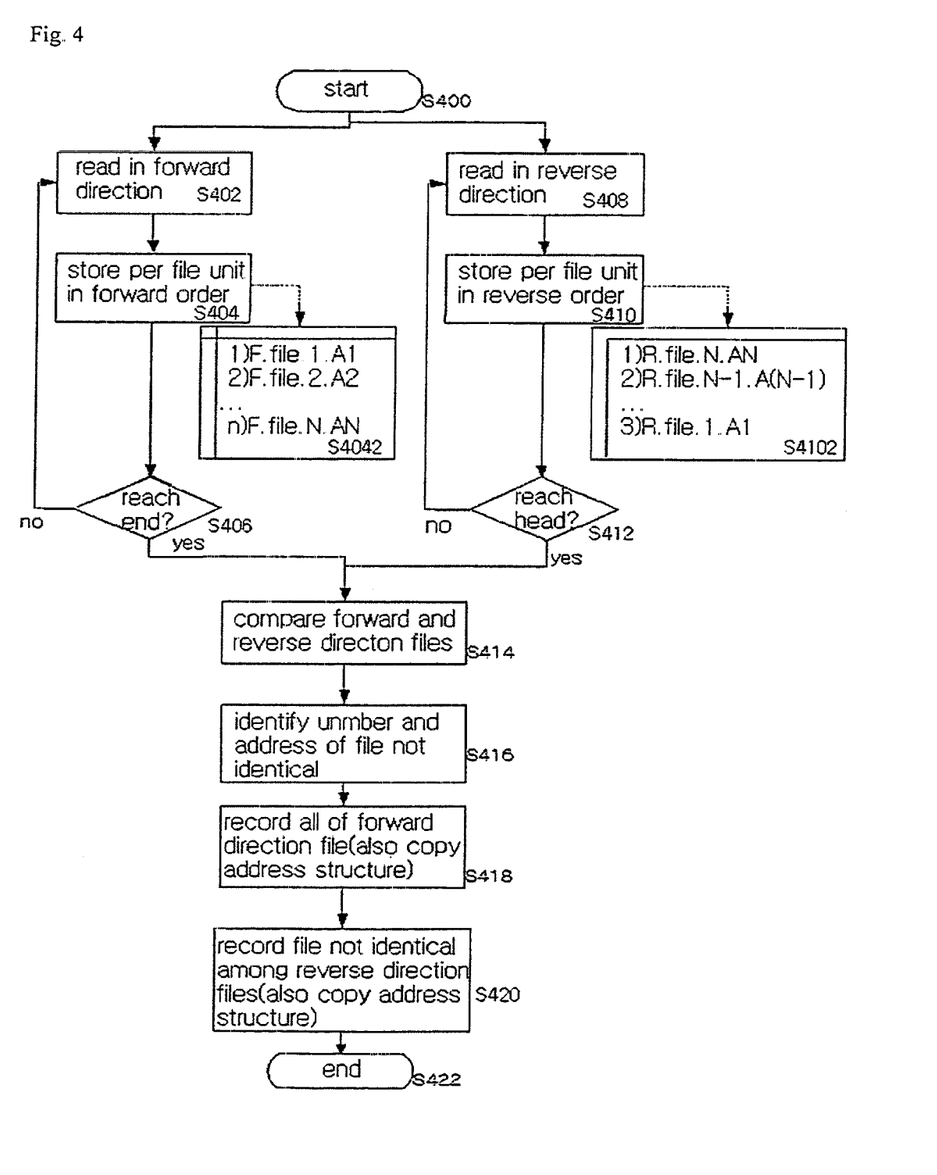
FIG. 4 is a flowchart showing an exemplary embodiment of the operation of a copying apparatus according to the present invention.

In addition, as shown in FIG. 4, the addresses (i.e. A1, A2 . . . AN) on the original recording medium are preferably stored together with the files.

On the other hand, the reverse direction files retrieved in the reverse direction are stored in a memory (not shown) in an order opposite to the retrieved order. If the firstly retrieved reverse direction file is represented by "R.file.1", the secondly retrieved reverse direction file is represented by "R.file.2" and the N-thly retrieved reverse direction file is represented by "R.file.N", these are stored in the memory in order to be identified in the order opposite to the retrieved order. To identify them in the order opposite to the retrieved order, a manner of assigning identification numbers consecutively decreasing as described above may be used. In this embodiment, to identify them in the order opposite to the retrieved order, an example using a manner of assigning identification numbers consecutively decreasing is shown (step S4042). "1), 2) . . . n)" shown in the step S4042 means the retrieved order.

In addition, as shown in FIG. 4, the addresses (i.e. AN, A(N−1) . . . A1) on the original recording medium are preferably stored together with the files.

Then, reading files from the original recording medium is completed upon reaching the head or end of the original recording medium (step S406 or S412), and the retrieved files are copied to the duplicate recording medium in order to maintain the same address structure as that of the original recording medium.

To perform copying, whether the retrieved forward and reverse direction files are identical or not is judged comparing these files each other (step S414). Here, to help understanding, it is assumed that B12 files are recorded on the original recording medium altogether and three of them are recorded on the overlap zone in FIG. 5. FIG. 5 shows a file structure of the original recording medium and a result of judging whether the corresponding forward and reverse direction files retrieved from the medium are identical to each other or not.

Figure 5:
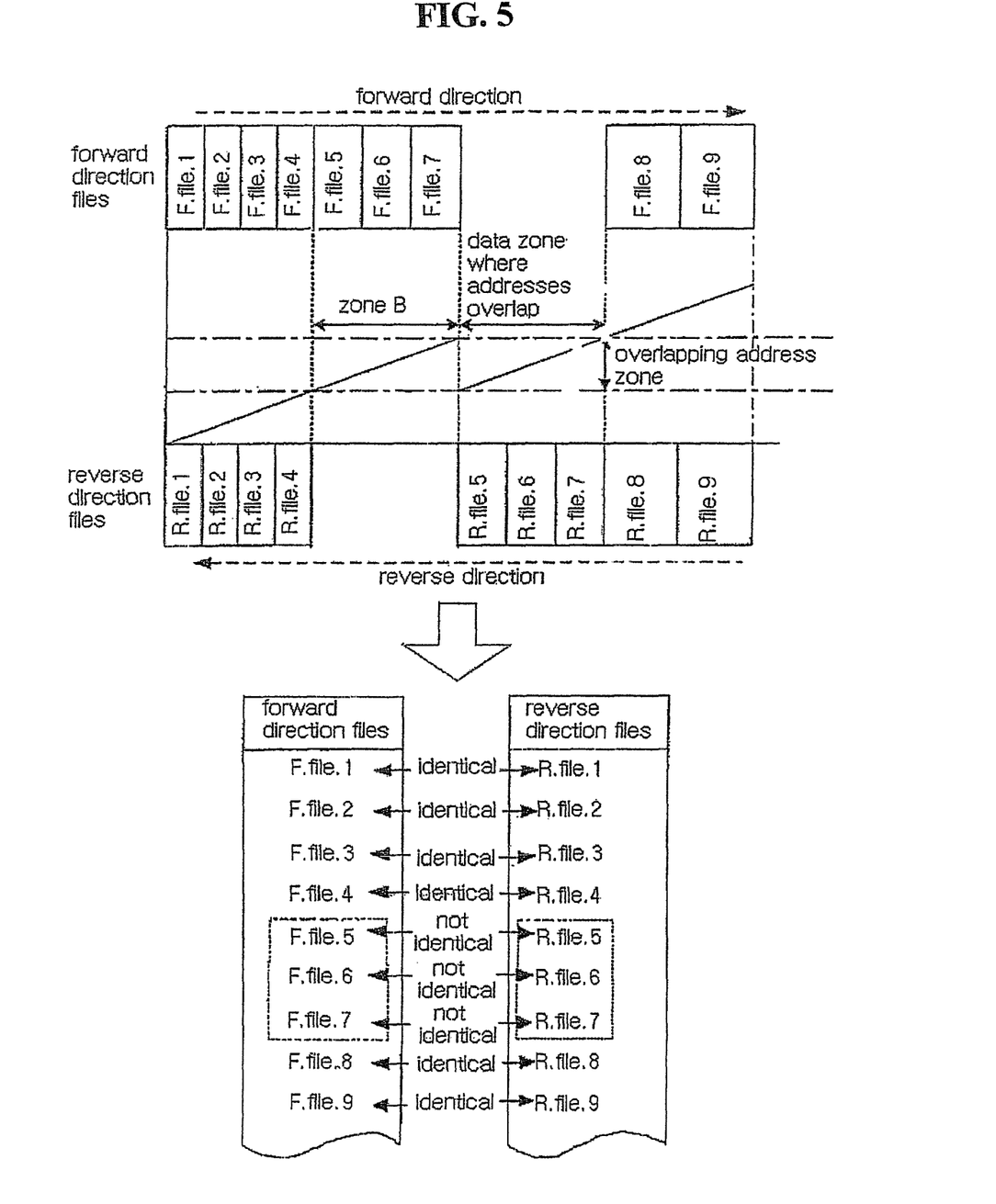
FIG. 5 shows a file structure of an original recording medium and a result of judging whether correspondingly forward and reverse direction files retrieved from the medium are identical to each other or not.

According to the example shown in FIG. 5, 12 files are recorded on the original recording medium in total, and when reading them in the forward direction nine forward direction files, i.e. F.file.1 to F.file.9 are retrieved, while in the reverse direction nine reverse direction files, i.e. R.file.1 to R.file.9 are retrieved. Amongst them, it was assumed that three files, i.e. R.file.5 to R.file.7 are recorded in the overlap zone where the addresses overlap, and three files, i.e. F.file.5 to F.file.7 are also recoded in the zone B.

As shown in FIG. 5, if the forward and reverse direction files whose identification numbers or whose addresses on the original recording medium are identical to each other are compared (step S414), it is verified that there are six pairs of forward and reverse direction files that are identical to each other, i.e. four pairs that are F.file.1 to F.file.4 and R.file.1 to R.file.4 and two pairs that are F.file.8 and F.file.9 and R.file.8 and R.file.9. In addition, it is verified that F.file.5 to F.file.7 amongst the forward direction files and R.file.5 to R.file.7 amongst the reverse direction files don't have any identical counterparts (step S416).

Accordingly, after completing identification of files the identified files are recorded on the duplicate recording medium in order to have the same address structure as that of the original recording medium (step S418). In other words, the forward direction files are first recorded (step S418). At this time, the address structure of the duplicate recording medium is also formed to copy the address structure of the original recording medium.

Then, the reverse direction files not having any identical counterparts (R.file.5 to R.file.7 in this embodiment) are recorded on the duplicate recording medium. At this time, it is particularly noted that the address structure of the reverse direction files not having any identical counterparts should be formed to be the same as that of the original recording medium (step S420).

Figure 6:
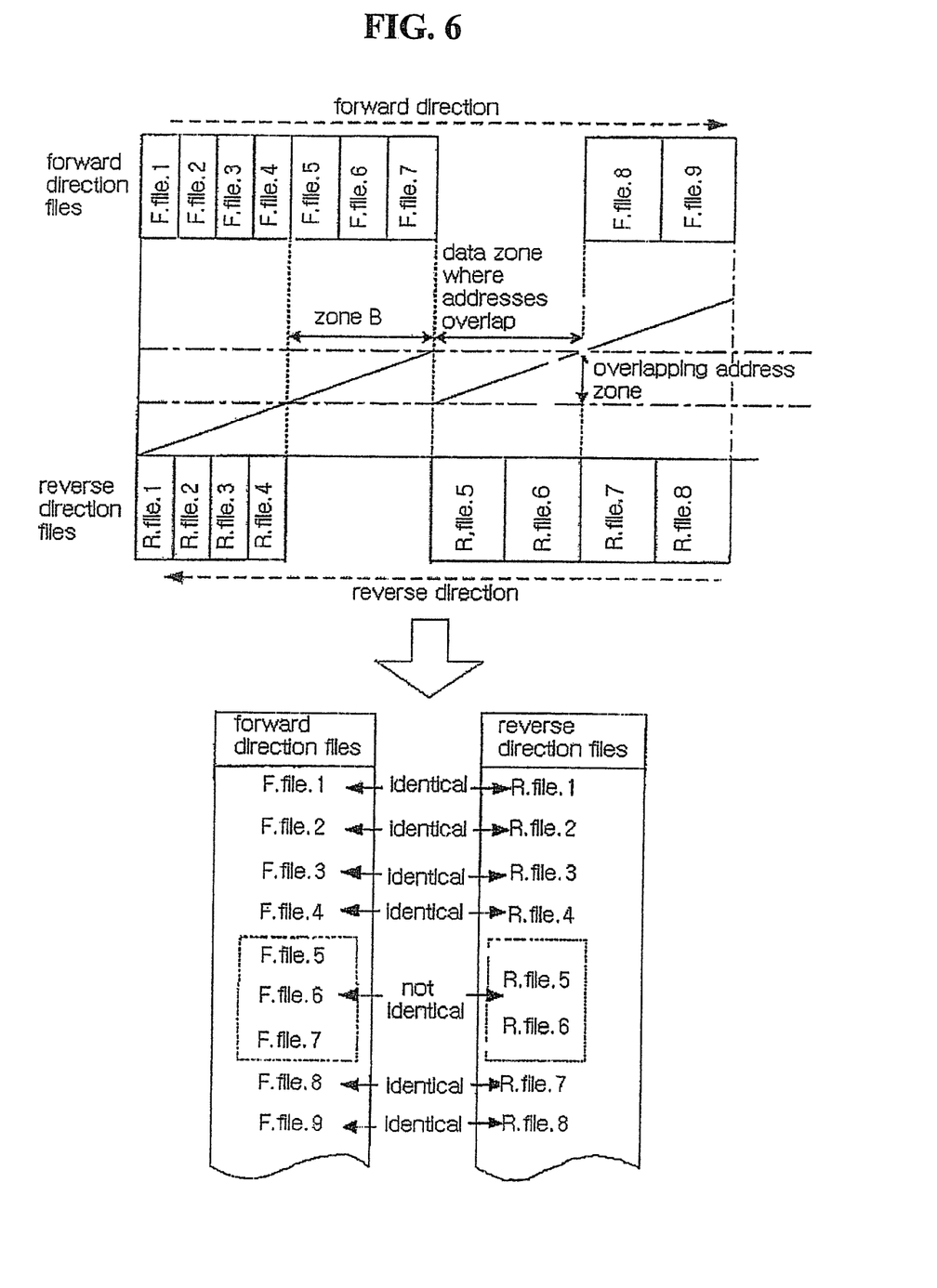
FIG. 6 shows a file structure of an original recording medium according to another exemplary embodiment and a result of judging whether correspondingly forward and reverse direction files retrieved from the medium are identical to each other or not.

FIG. 6 shows a file structure of the original recording medium according to another exemplary embodiment of the present invention and a result of judging whether the corresponding forward and reverse direction files retrieved from the medium are identical to each other. As shown in FIG. 6, B1 files are recorded on the original recording medium in total, and when reading them in the forward direction, nine forward direction files, i.e., F.file.1 to F.file.9, are retrieved, while in the reverse direction eight reverse direction files, i.e., R.file.1 to R.file.8, are retrieved. Amongst them, it is assumed that two files, i.e., R.file.5 and R.file.6, are recorded in the overlap zone where the addresses overlap, and three files, i.e., F.file.5 to F.file.7, are also recorded in the zone B.

Although it was assumed that the number of the forward direction files and the number of the reverse direction files are not the same in this embodiment, whether the identical counterparts exist can also be verified by referring to the addresses of files retrieved and comparing the addresses to each other. Accordingly, all the description in relation to FIG. 5 can be applied to this embodiment similarly.

Figure 7A:
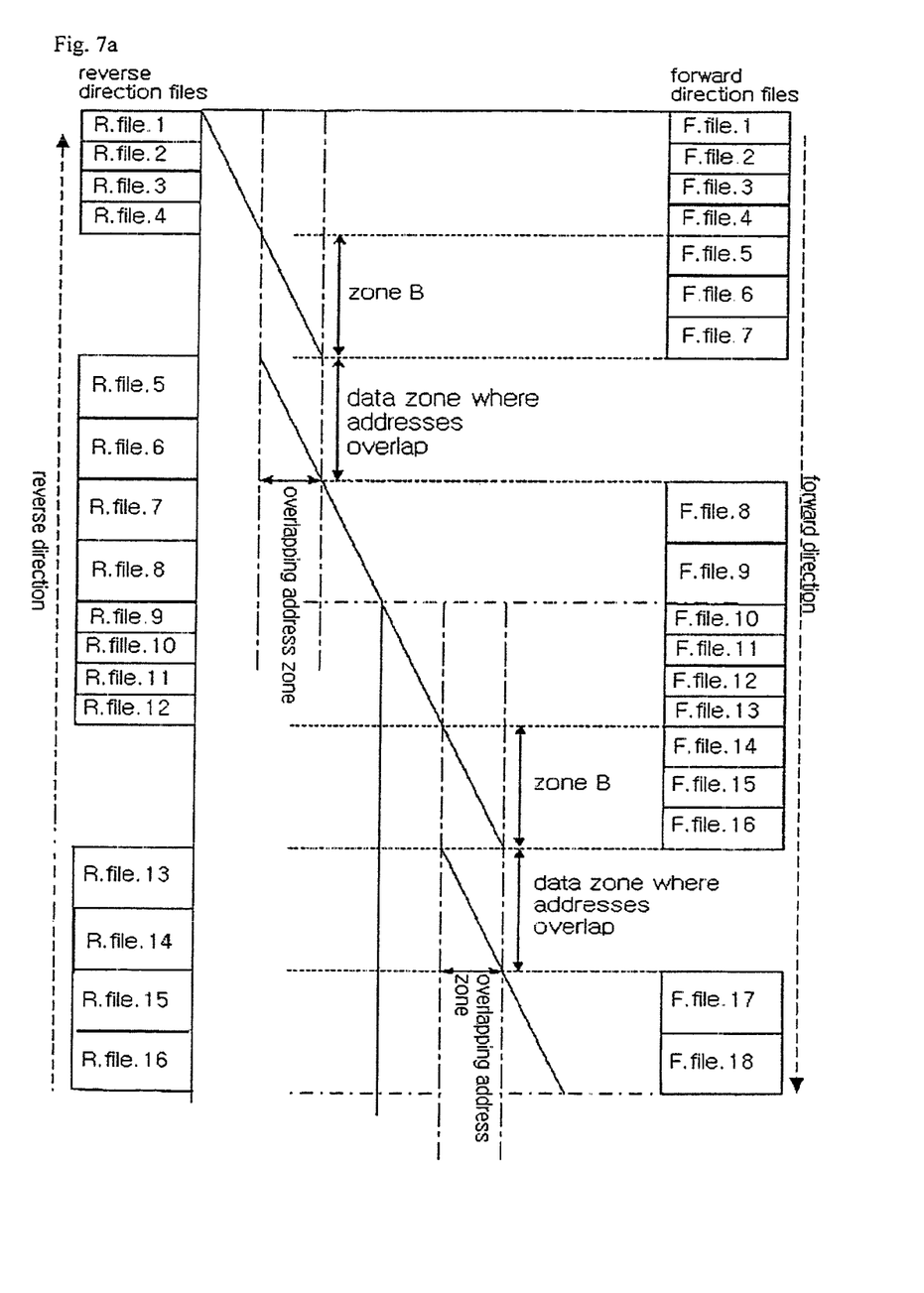
FIG. 7a shows a file structure of an original recording medium according to another embodiment of the present invention.
Figure 7B:
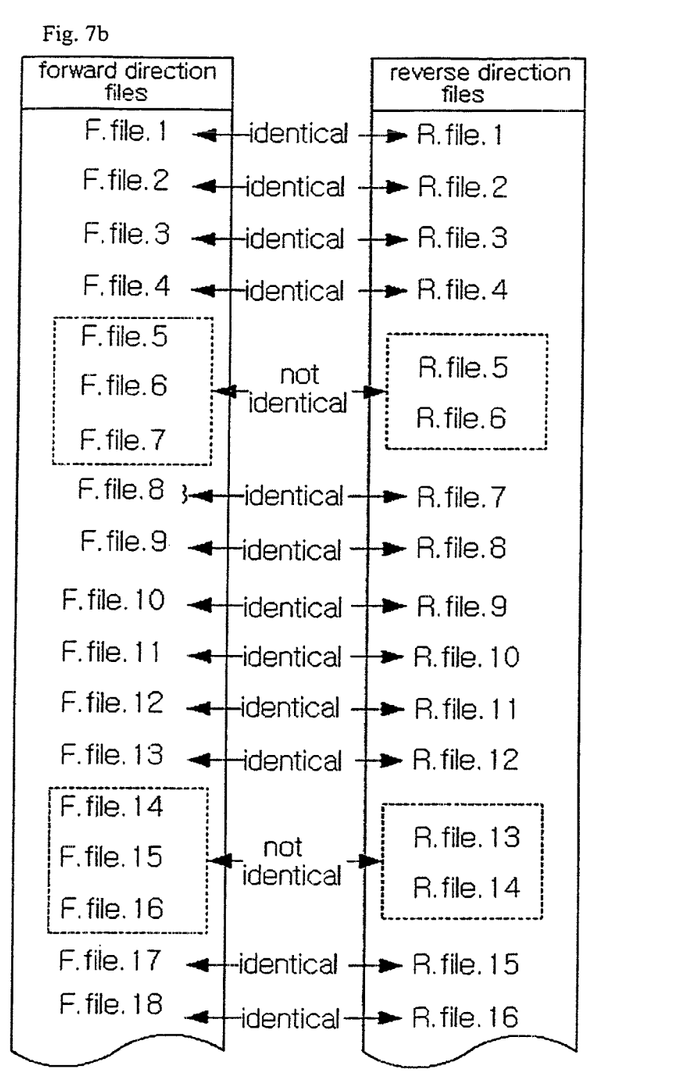
FIG. 7b shows a result of judging whether correspondingly forward and reverse direction files retrieved from the medium are identical to each other or not.

FIG. 7a shows a file structure of the original recording medium according to another embodiment of the present invention, and FIG. 7b shows a result of judging whether the corresponding forward and reverse direction files retrieved is from the medium are identical to each other or not.

As shown in FIG. 7a, 22 files are recorded on the original recording medium in total, and when reading them in the forward direction 18 forward direction files, i.e. F.file.1 to F.file.18 are retrieved, while in the reverse direction 16 reverse direction files, i.e. R.file.1 to R.file.16 are retrieved. As shown in FIG. 7a, two overlap zones are formed in this present embodiment and four files, i.e. R.file.5, R.file.6, R.file.13 and R.file.14 are recorded in the overlap zones respectively. In addition, two of the zones B corresponding to these overlap zones are also formed, and it is assumed that 6 files, i.e. F.file.5 to F.file.7 and F.file.14 to F.file.16 are recorded there.

Although it was also assumed that the number of the forward direction files and the number of the reverse direction files are not the same in this embodiment, whether the identical counterparts exist or not can also be verified by referring the addresses of files retrieved and comparing the addresses each other. Accordingly, all the description in relation to FIG. 5 can be applied to this embodiment similarly.

Further, although the information recorded on the original recording medium is retrieved, managed, and processed in the unit of files, any proper units (e.g. blocks), though they are in the form of files, may also be retrieved, managed, and processed depending upon embodiments. Accordingly, as used herein, the term "file" should be interpreted and understood to means a "unit per which a process is performed" in the description above and in the claims below.

The copying method according to the present invention can be realized a computer program for copying a recording medium including modules programmed for performing the functions of the units 110 to 116 included in the copying apparatus 100 of the present invention as described above, i.e. a file reading module (not shown), a file comparing and identifying module (not shown), an address processing module (not shown) and a file recording module (not shown). This computer program for copying a recording medium according to the present invention realizes technical ideas of the present invention by interacting with the hardware and/or software of a computer system for executing the program. Programming the above modules included the computer program for copying a recording medium of the present invention will not be described in detail because it is already widely known in the art of the present invention as well as being an optional matter in design for carrying out the present invention.

According to present invention, it is possible to provide a lawful user with a copying apparatus, a method and a computer program thereof capable of copying a recording medium including an overlap zone where addresses overlap.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A copy method for copying an optical medium, comprising:

reading a first optical medium having an address overlap zone in a forward direction, wherein the address overlap zone has logical address values which are identical to logical address values of another physical area located immediately prior to the address overlap zone in the forward direction for copy protection and first data included in said another physical area are read only in said reading in the forward direction;

reading the first optical medium in a reverse direction, wherein second data included in the address overlap zone are read only in said reading in the reverse direction, wherein the first data read in the forward direction and the second data read in the reverse direction are different from each other;

recording the first data included in said another physical area on a second optical medium; and recording the second data included in the address overlap zone, on the second optical medium.

2. The copy method of claim 1, wherein the logical address values of said another physical area linearly increase in the forward direction.

3. The copy method of claim 2, wherein the logical address values of the address overlap zone linearly increase in the forward direction, wherein the linearly increasing logical address values of the address overlap zone are identical to the linearly increasing logical address values of said another physical area.

4. The copy method of claim 1, wherein the first and second optical mediums are compact discs.

5. The copy method of claim 1, wherein the first and second optical mediums are DVDs.

6. A method of copying an optical medium, comprising:
reading a first optical medium in a forward direction, the first optical medium including a first address overlap zone and a second address overlap zone which is physically located immediately prior to the first address overlap zone in the forward direction, logical address values of the first address overlap zone being identical to logical address values of the second overlap zone, wherein first data included in the first overlap zone are read only in the forward direction;
reading the first optical medium in a reverse direction, wherein second data included in the second address overlap zone are read only in the reverse direction, wherein the first data read in the forward direction and the second data read in the reverse direction are different from each other;
recording the first data read in the forward direction on a second optical medium; and
recording the second data read in the reverse direction on the second optical medium.

* * * * *